United States Patent
Fujii et al.

(10) Patent No.: US 7,728,699 B2
(45) Date of Patent: Jun. 1, 2010

(54) ACOUSTIC WAVE FILTER

(75) Inventors: Yasuhisa Fujii, Kanazawa (JP); Masaru Yata, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/359,424

(22) Filed: Jan. 26, 2009

(65) Prior Publication Data
US 2009/0121810 A1 May 14, 2009

Related U.S. Application Data

(63) Continuation of application No. PCT/JP2007/066305, filed on Aug. 22, 2007.

(30) Foreign Application Priority Data

Sep. 28, 2006 (JP) ............... 2006-265610

(51) Int. Cl.
*H03H 9/145* (2006.01)
*H03H 9/64* (2006.01)
(52) U.S. Cl. ................... 333/196; 310/313 C
(58) Field of Classification Search ......... 333/194–196; 310/313 C
See application file for complete search history.

(56) References Cited

U.S. PATENT DOCUMENTS

| | | | | |
|---|---|---|---|---|
| 4,143,343 A | * | 3/1979 | Inoue et al. | 333/194 |
| 5,635,883 A | * | 6/1997 | Penunuri et al. | 333/195 |
| 5,936,488 A | * | 8/1999 | Taguchi et al. | 333/195 |
| 2005/0001696 A1 | | 1/2005 | Otsuka et al. | |
| 2006/0208834 A1 | | 9/2006 | Takamine | |

FOREIGN PATENT DOCUMENTS

| | | | |
|---|---|---|---|
| JP | 09-205342 A | | 8/1997 |
| JP | 9-214281 | * | 8/1997 |
| JP | 10-261936 A | | 9/1998 |

OTHER PUBLICATIONS

Official Communication issued in International Patent Application No. PCT/JP2007/066305, mailed on Oct. 9, 2007.

* cited by examiner

*Primary Examiner*—Barbara Summons
(74) *Attorney, Agent, or Firm*—Keating & Bennett, LLP

(57) ABSTRACT

A longitudinally coupled resonator acoustic wave filter device that utilizes an inter-IDT resonance mode with a reduced insertion loss has a structure in which apodization weights are assigned in first to third IDTs having narrow pitch electrode finger portions in portions other than the narrow pitch electrode finger portions, such that the electrode finger overlap width sequentially varies in an acoustic wave propagating direction in which an acoustic wave propagates, and portions of the IDTs located at ends adjacent to the narrow pitch electrode finger portions have a maximum electrode finger overlap width.

10 Claims, 6 Drawing Sheets

ACOUSTIC WAVE FILTER

BACKGROUND OF THE INVENTION

1. Field of the Invention

The present invention relates to an acoustic wave filter device used as, for example, an RF band-pass filter of a cellular phone, and, more particularly, to a longitudinally coupled resonator acoustic wave filter device that utilizes a boundary acoustic wave or a surface acoustic wave.

2. Description of the Related Art

Surface acoustic wave filter devices are widely used as RF band-pass filters of cellular phones.

Japanese Patent Application Publication No. 10-261936 discloses a surface acoustic wave filter device used for an application of this type.

As shown in FIG. 9, in a surface acoustic wave filter device 501 described in Japanese Patent Application Publication No. 10-261936, an electrode structure schematically shown in FIG. 9 is provided on a piezoelectric substrate 502. That is, a pair of input IDTs 503 are arranged in parallel on the piezoelectric substrate 502. Output IDTs 504 are arranged with respect to the IDTs 503 in a surface acoustic wave propagating direction in which a surface acoustic wave propagates.

Reflectors 505 are arranged respectively on both sides of the portion in which one pair of input IDT 503 and output IDT 504 are provided in the surface acoustic wave propagating direction. Similarly, other reflectors 505 are arranged respectively on both sides of the region in which the other pair of input IDT 503 and output IDT 504 are provided in the surface acoustic wave propagating direction. Then, one end of each of the pair of input IDTs 503 is connected in common to an input terminal 506 and the other ends are connected to a ground. One end of each of the pair of output IDTs 504 is connected in common to an output terminal 507, and the other ends are connected to a ground.

In order to reduce a higher transverse mode that causes a spurious response, apodization weights are assigned in the input IDTs 503 and output IDTs 504. In a normal type IDT, the electrode finger overlap width does not vary along both sides in the surface acoustic wave propagating direction. In contrast, apodization weighting is a method of providing weights so that the electrode finger overlap width of an IDT is varied to vary the overlap width in the surface acoustic wave propagating direction.

In the surface acoustic wave filter device described in Japanese Patent Application Publication No. 10-261936, the apodization weights are assigned in the IDTs as described above, so that a higher transverse mode is reduced.

On the other hand, a surface acoustic wave filter device may include narrow pitch electrode finger portions that are located at portions at which IDTs are located adjacent to each other. The interval of electrode fingers of each narrow pitch electrode finger portion is less than that of the remaining portions. In such a surface acoustic wave filter, that is, in a longitudinally coupled resonator surface acoustic wave filter device that utilizes an inter-IDT resonance mode, the transverse mode spurious response is not problematic. This is because the confinement effect as a waveguide is relatively small.

In recent years, various boundary acoustic wave filter devices that utilize a boundary acoustic wave have also been developed. The boundary acoustic wave filter devices have a problem in that, as compared to the surface acoustic wave filter devices, the trapping effect as a waveguide is relatively large and, therefore, a spurious response due to a transverse mode tends to be relatively large. In such boundary acoustic wave filter devices, even when resonance between IDTs that have narrow pitch electrode finger portions are utilized, a spurious response due to a transverse mode tends to be relatively large.

Furthermore, in the surface acoustic wave filter devices and the boundary acoustic wave filter devices, in order to reduce the size, when the overlap width of each IDT is reduced, a transverse mode spurious response is likely to occur.

Thus, even in the surface acoustic wave filter devices that utilize an inter-IDT resonance mode, when the size is reduced, a transverse mode spurious response tends to occur.

Thus, in the surface acoustic wave filter devices and boundary acoustic wave filter devices that utilize an inter-IDT resonance mode, there has not been provided or developed a filter device that can further reduce a spurious response due to a transverse mode with a further reduced loss.

SUMMARY OF THE INVENTION

To overcome the problems described above, preferred embodiments of the present invention provide a longitudinally coupled resonator acoustic wave filter device that utilizes an inter-IDT resonance mode with a further reduced loss.

According to a preferred embodiment of the present invention, an acoustic wave filter device includes a piezoelectric body, a first IDT arranged on the piezoelectric body, second and third IDTs arranged respectively on both sides of the first IDT in an acoustic wave propagating direction in which an acoustic wave propagates, and first and second reflectors arranged respectively on both side of the portion in which the first to third IDTs are provided in the acoustic wave propagating direction, wherein at portions in which the IDTs are located adjacent to each other in the acoustic wave propagating direction, the interval of electrode fingers of portions of the IDTs, at ends that are adjacent to an adjacent IDT, is less than the interval of electrode fingers of the remaining portions of the IDTs to thereby define narrow pitch electrode finger portions in which the interval of electrode fingers are relatively narrow. The acoustic wave filter device preferably is a longitudinally coupled resonator acoustic wave filter device that utilizes an inter-IDT resonance mode, and apodization weights are assigned in the first to third IDTs having the narrow pitch electrode finger portions, at portions other than the narrow pitch electrode finger portions, such that the electrode finger overlap width sequentially varies in the acoustic wave propagating direction and portions located at ends adjacent to the narrow pitch electrode finger portions have a maximum electrode finger overlap width.

Preferably, the apodization weights are assigned such that, in the first IDT, a minimum overlap width portion is located in the approximate middle of the first IDT in the acoustic wave propagating direction and the maximum overlap width portions are located at end portions of the first IDT having the apodization weights adjacent to the second IDT and adjacent to the third IDT, wherein a portion surrounded by a single pair of envelope lines defined by the apodization weights has a substantial drum shape. In this case, an insertion loss within the band can be further reduced.

Preferably, the apodization weights are assigned such that a maximum overlap width portion is located at an end of the portion of the second IDT having the apodization weights adjacent to the first IDT, a minimum overlap width portion is located at an end of the portion of the second IDT having the apodization weights, adjacent to the first reflector, and the overlap width sequentially reduces from the maximum overlap width to the minimum overlap width, and a maximum overlap width portion is located at an end of the portion of the third IDT having the apodization weights adjacent to the first IDT, a minimum overlap width portion is located at an end of the portion of the third IDT having the apodization weights adjacent to the second reflector, and the overlap width sequentially reduces from the maximum overlap width portion to the minimum overlap width portion. Thus, it is possible to effectively suppress a ripple within the pass band.

Preferably, at a portion at which the first and second IDTs are located adjacent to each other, the apodization weights are assigned such that the overlap widths of electrode fingers of the respective first and second IDTs, located substantially equidistantly from the middle between the first and second IDTs, are substantially equal, and wherein at a portion at which the first and third IDTs are located adjacent to each other, the overlap widths of electrode fingers of the respective first and third IDTs, located substantially equidistantly from the middle between the first and third IDTs, are substantially equal. Thus, it is possible to further effectively suppress a ripple within the pass band.

In the acoustic wave filter device according to preferred embodiments of the present invention, preferably, fourth and fifth IDTs are respectively arranged on both sides of the portion in which the first to third IDTs are provided in the acoustic wave propagating direction, and the first and second reflectors are respectively arranged on both sides of the portion in which the first to fifth IDTs are provided in the acoustic wave propagating direction. In this case, because it is a five-IDT type longitudinally coupled resonator acoustic wave filter device, it is possible to improve power withstanding capability, and also to further reduce an insertion loss.

In the structure in which the first to fifth IDTs are provided, preferably, the apodization weights are assigned in the second IDT such that a minimum overlap width portion is located at the approximate middle of the second IDT in the acoustic wave propagating direction and maximum overlap width portions are located at end portion of the second IDT having the apodization weights adjacent to the fourth IDT and adjacent to the first IDT, wherein a portion surrounded by a single pair of envelope lines defined by the apodization weights has a substantial drum shape. In this case, it is possible to further reduce an insertion loss within the pass band.

In addition, preferably, in the structure in which the first to fifth IDTs are provided, the apodization weights are assigned in the third IDT such that a minimum overlap width portion is located at the approximate middle of the third IDT in the acoustic wave propagating direction and maximum overlap width portions are located at end portions of the third IDT having the apodization weights adjacent to the first IDT and adjacent to the fifth IDT, whereby a portion surrounded by a single pair of envelope lines defined by the apodization weights has a substantial drum shape. In this case, it is possible to further reduce an insertion loss within the pass band.

Furthermore, preferably, the second and fourth IDTs respectively include narrow pitch electrode finger portions at a portion at which the second IDT and the fourth IDT are located adjacent to each other, the third and fifth IDTs respectively include narrow pitch electrode finger portions at a portion at which the third and fifth IDTs are located adjacent to each other, apodization weights are assigned in the fourth and fifth IDTs, in portions other than the narrow pitch electrode finger portions, such that the electrode finger overlap width sequentially varies in the acoustic wave propagating direction, and the electrode fingers of ends of the portions of the fourth and fifth IDTs having the apodization weights, respectively adjacent to the second and third IDTs, have a maximum overlap width. With this arrangement, it is possible to effectively suppress a ripple within the pass band.

The acoustic wave filter device according to preferred embodiments of the present invention may preferably further include a dielectric body layer laminated on the piezoelectric body. In this case, it is possible to utilize a boundary acoustic wave as an acoustic wave to provide a boundary acoustic wave filter device. Alternatively, a surface acoustic wave may also be used as an acoustic wave, and in this case, it is possible to provide a surface acoustic wave filter device.

The acoustic wave filter device according to preferred embodiments of the present invention utilizes an inter-IDT resonance mode and includes IDTs having narrow pitch electrode finger portions. In the acoustic wave filter device, the apodization weights are preferably assigned in the first to third IDTs, at portions other than the narrow pitch electrode finger portions, such that ends of the IDTs adjacent to the narrow pitch electrode finger portions have a maximum electrode finger overlap width. Thus, it is possible to reduce an insertion loss within the pass band.

Therefore, it is possible to provide an acoustic wave filter device that includes narrow pitch electrode finger portions, that utilizes an inter-IDT resonance mode, that is not significantly influenced by a transverse mode spurious response, and that has a reduced insertion loss.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Hereinafter, preferred embodiments of the present invention will be described with reference to the accompanying drawings.

Figure 1:
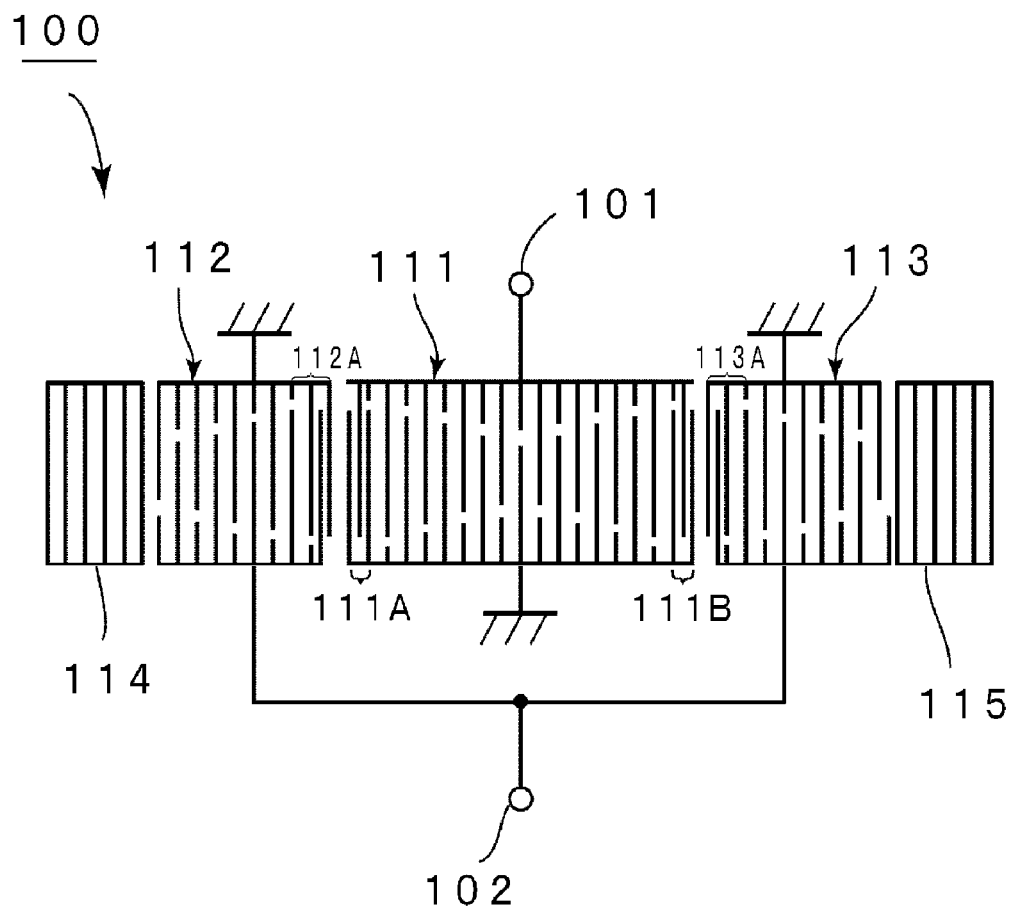
FIG. 1 is a schematic plan view that shows the electrode structure of a boundary acoustic wave filter device according to a preferred embodiment of the present invention.
Figure 2:
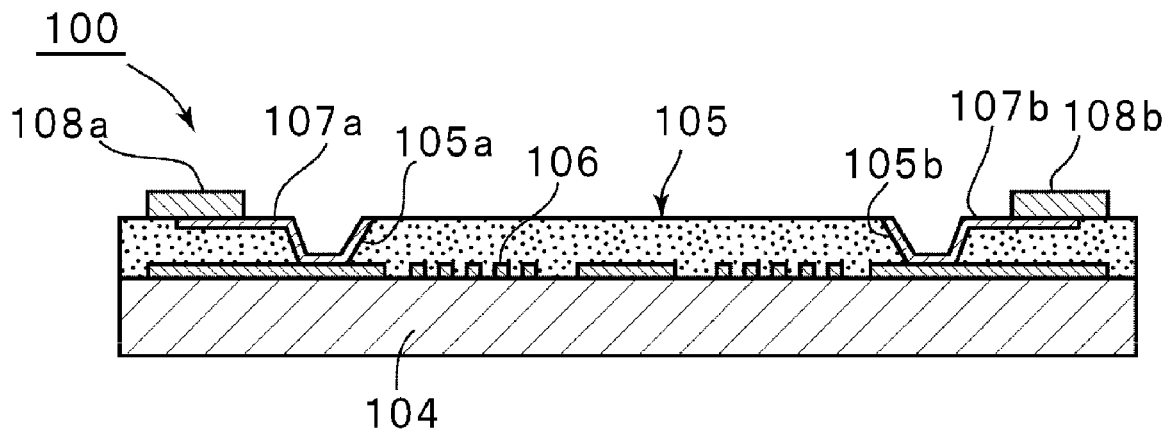
FIG. 2 is a schematic front cross-sectional view of the boundary acoustic wave filter device shown in FIG. 1.

FIG. 1 is a schematic plan view that shows the electrode structure of a boundary acoustic wave filter device according to a preferred embodiment of the present invention. FIG. 2 is a schematic front cross-sectional view of the boundary acoustic wave filter device.

As shown in FIG. 2, the boundary acoustic wave filter device 100 includes a piezoelectric body 104 and a dielectric body 105 laminated on the piezoelectric body 104. An electrode film 106 is disposed between the piezoelectric body 104 and the dielectric body 105. In the present preferred embodiment, the electrode film 106 defines the electrode structure shown in FIG. 1. Therefore, the boundary acoustic wave filter device that utilizes a boundary acoustic wave propagating along a boundary between the piezoelectric body 104 and the dielectric body 105 is provided.

The piezoelectric body 104 is made of a monocrystal substrate made of an approximately 15 degrees rotated Y-cut X-propagating LiNbO$_3$, for example. Note that the dielectric body 105 is preferably made of SiO$_2$.

The electrode film 106 is formed such that an Au thin film having a thickness of about 90 nm, for example, is deposited and patterned.

In addition, as shown in FIG. 2, the dielectric body 105 has a plurality of openings 105a and 105b. Conductive patterns 107a and 107b are disposed in the openings 105a and 105b. Portions that are electrically connected to the outside of the electrode film 106 are exposed in the openings 105a and 105b. The conductive patterns 107a and 107b are electrically connected to the portions that are electrically connected to the outside of the electrode film 106. The conductive patterns 107a and 107b are arranged so as to extend onto the upper surface of the dielectric body 105 and are electrically connected to external terminals 108a and 108b.

The electrode film 106 defines the electrode structure shown in FIG. 1. That is, a longitudinally coupled resonator boundary acoustic wave filter portion shown in FIG. 1 is provided between an input terminal 101 and an output terminal 102. Here, a first IDT 111 is arranged in the middle, and second and third IDTs 112 and 113 are arranged respectively on both sides of the IDT 111 in a boundary acoustic wave propagating direction in which a boundary acoustic wave propagates. Then, reflectors 114 and 115 are respectively arranged on both sides of the region in which the IDTs 111 to 113 are provided in the boundary acoustic wave propagating direction. Narrow pitch electrode finger portions are provided in the IDTs 111 to 113 at portions at which two IDTs are located adjacent to each other. For example, narrow pitch electrode finger portions 112A and 111A are provided at portions in which the IDT 112 and the IDT 111 are located adjacent to each other. The narrow pitch electrode finger portion is a portion of an end portion of the IDT in which the interval of electrode fingers is less than the interval of electrode fingers of the other portions of the IDT. In addition, at portions in which the IDT 111 and the IDT 113 are located adjacent to each other, a narrow pitch electrode finger portion 111B is provided in the IDT 111, and a narrow pitch electrode finger portion 113A is provided in the IDT 113.

In the present preferred embodiment, the narrow pitch electrode finger portions 111A, 111B, 112A and 113A are provided in the three-IDT type longitudinally coupled resonator boundary acoustic wave filter portion, whereby, an insertion loss is reduced in the longitudinally coupled resonator boundary acoustic wave filter portion that utilizes an inter-IDT resonance mode.

In addition, the apodization weights are assigned in the IDTs 111 to 113 other than in the narrow pitch electrode finger portions such that portions located at end portions of the apodized portions adjacent to the narrow pitch electrode finger portions have a maximum electrode finger overlap width.

In the present preferred embodiment, the apodization weights are assigned in the first IDT 111 such that a minimum overlap width portion is located in the approximate middle in the boundary acoustic wave propagating direction and portions having a maximum overlap width are located at end portions of the weighted portion adjacent to the second IDT 112 and to the third IDT 113. Thus, the shape surrounded by envelope lines is substantially tsudumi-shaped, i.e. Japanese drum-shaped, in which a width is a maximum at approximate center and gradually reduces towards both ends.

A maximum overlap width portion is located at an end portion of the weighted portion of the second IDT 112 adjacent to the first IDT 111, and the overlap width of the weighted portion at an end portion adjacent to the first reflector 114 is set to have a minimum overlap width. Then, the overlap width is sequentially reduced from the maximum overlap width to the minimum overlap width. Similarly, in the third IDT 113, a maximum overlap width portion of the weighted portion is located at an end portion adjacent to the first IDT 111, a minimum overlap width portion of the weighted portion is located at an end portion adjacent to the second reflector 115. Then, the overlap width is sequentially reduced from the maximum overlap width portion to the minimum overlap width portion.

Preferably, the apodization weights are assigned so that, at portions at which the first IDT 111 and the second IDT 112 are located adjacent to each other, the overlap widths of electrode fingers located equidistantly from the approximate middle between the first and second IDTs 111 and 112 are substantially equal. Similarly, at portions at which the first and third IDTs 111 and 113 are located adjacent to each other, the apodization weights are assigned so that the overlap widths of electrode fingers of the first and third IDTs 111 and 113, located equidistantly from the approximate middle between the first and third IDTs 111 and 113 are substantially equal. With this configuration, it is possible to further effectively suppress a transverse mode ripple.

In the present preferred embodiment, due to the apodization weights, it is possible to reduce a transverse mode spurious response within the pass band, and also to obtain a favorable filter characteristic with less insertion loss. This will be more specifically described below.

The boundary acoustic wave filter device 100 of the present preferred embodiment having the electrode structure shown in FIG. 1 was manufactured in the following specifications.

First IDT 111: The total number of electrode fingers including the narrow pitch electrode finger portions was 35, the overlap width of the minimum overlap width portion was about 28 μm, and the overlap width of each maximum overlap width portion was about 40 μm.

Second and third IDTs 112 and 113: The total number of electrode fingers including the narrow pitch electrode finger portion was 19, the overlap width of the minimum overlap width portion was about 28 μm, and the overlap width of the maximum overlap width portion was about 40 μm.

First and second reflectors 114 and 115: The number of electrode fingers was 25.

In the IDTs 111 to 113, the interval of the electrode fingers, other than the narrow pitch electrode finger portions, was about 0.804 μm, and the interval of the electrode fingers of each of the narrow pitch electrode finger portions 111A, 111B, 112A and 113A was about 0.739 μm. The number of electrode fingers in each of the narrow pitch electrode finger portions was three. In addition, the interval of the electrode fingers of each of the reflectors 114 and 115 was about 0.797 µm.

Figure 4:
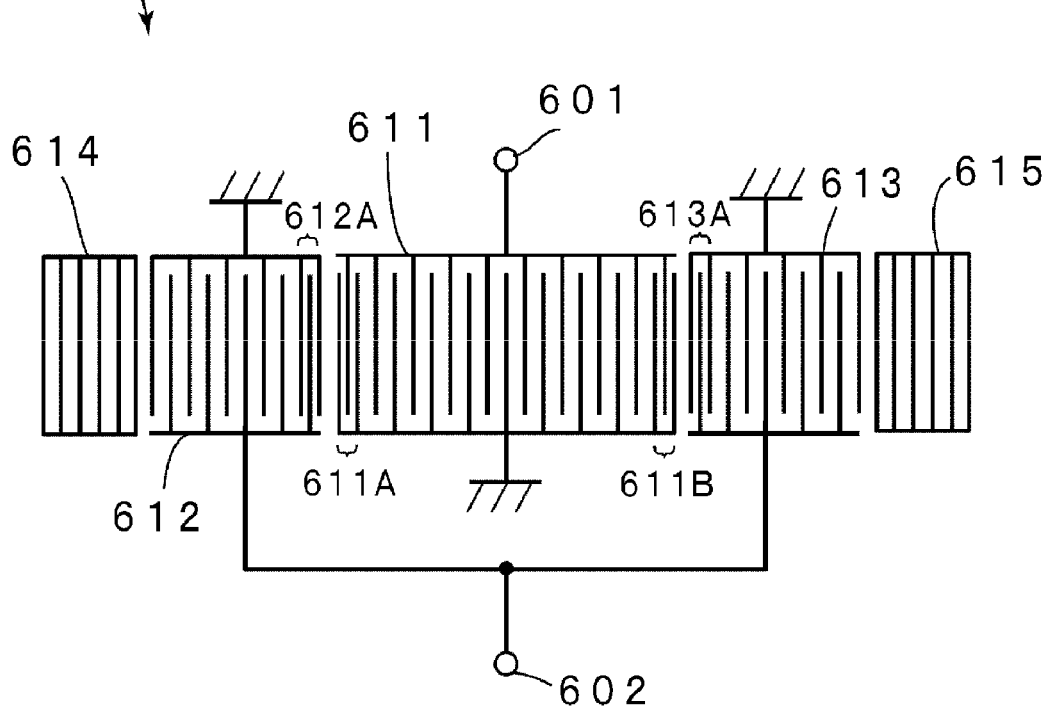
FIG. 4 is a schematic plan view that shows the electrode structure of a boundary acoustic wave filter device according to a first comparative example.

In a boundary acoustic wave filter device 600 shown in FIG. 4 that was prepared for comparison, the overlap width of each of IDTs 611 to 613 was about 40 µm.

Note that apodization weights are not assigned to the narrow pitch electrode finger portions 111A, 111B, 112A and 113A. That is, in each narrow pitch electrode finger portion, the overlap width is set to the maximum overlap width, e.g., about 40 µm.

Figure 3:
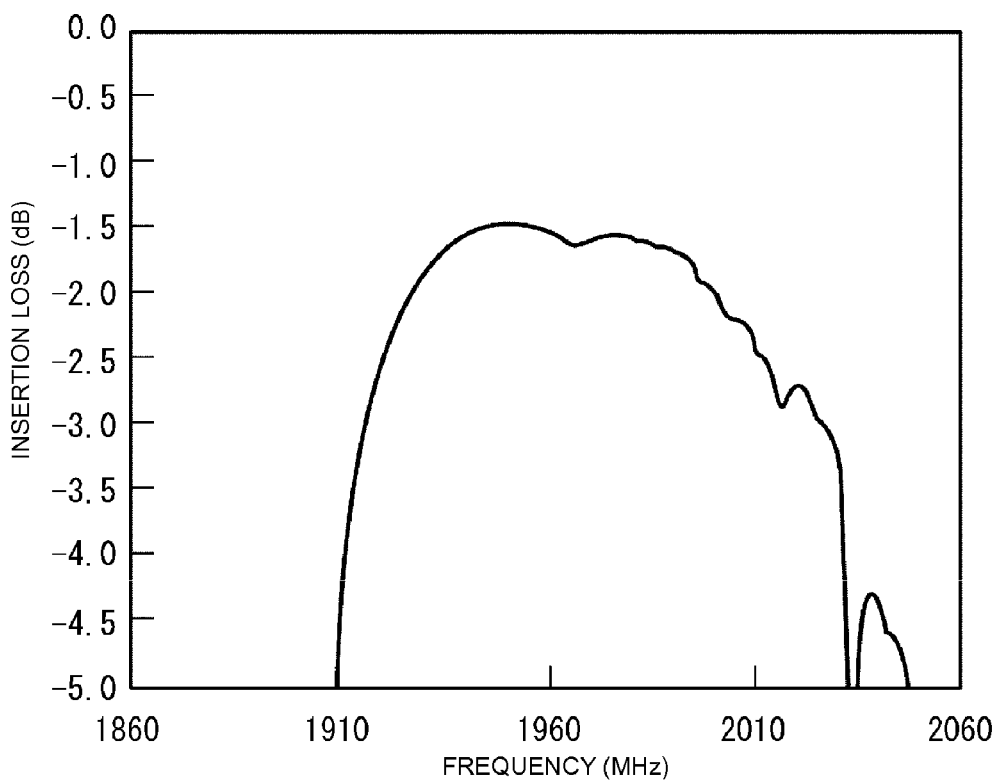
FIG. 3 is a view that shows the filter characteristic of the boundary acoustic wave filter device according to a preferred embodiment of the present invention.
Figure 5:
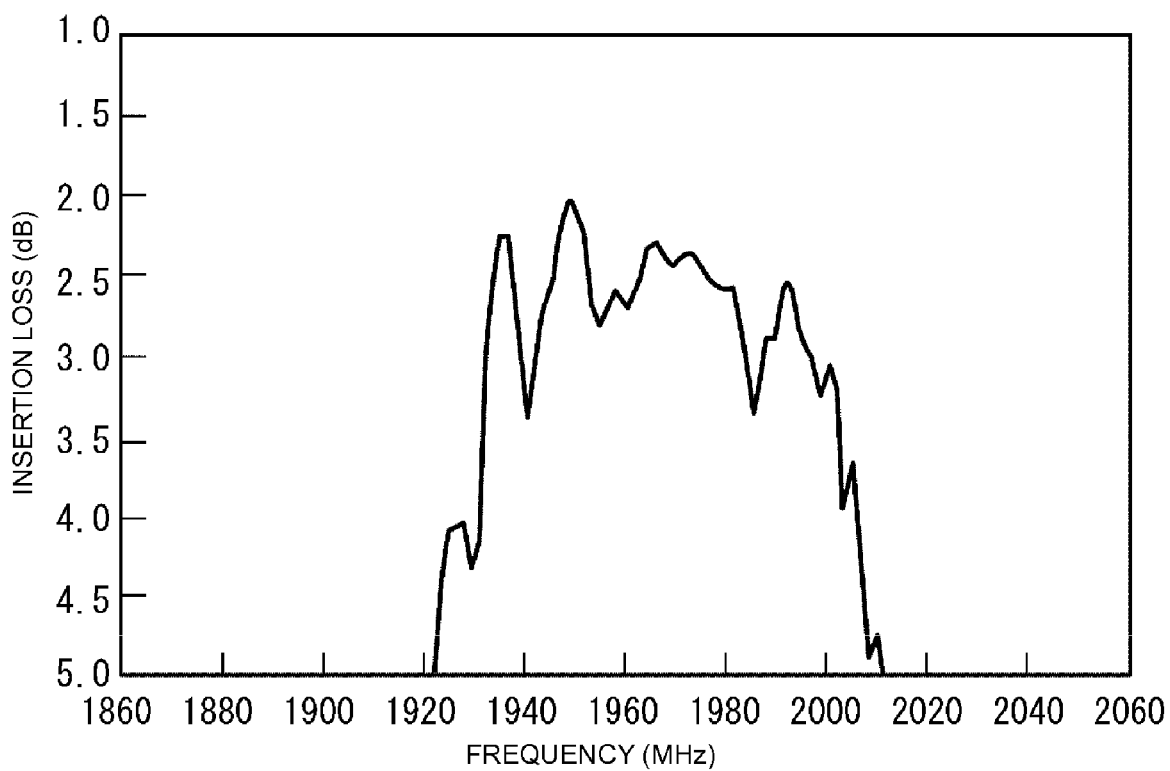
FIG. 5 is a view that shows the filter characteristic of the boundary acoustic wave filter device according to the first comparative example.

FIG. 4 is a schematic plan view that shows the electrode structure of a known boundary acoustic wave filter device prepared for comparison. In the boundary acoustic wave filter device 600 shown in FIG. 4, the electrode structure is provided between an input terminal 601 and an output terminal 602. That is, except that the above-described apodization weights are not assigned, the electrode structure, which is similar to that of the boundary acoustic wave filter device 100, is provided. Second and third IDTs 612 and 613 are respectively arranged on both sides of a first IDT 611, and reflectors 614 and 615 are respectively provided on both sides of the portion in which the IDTs 611 to 613 are provided in the boundary acoustic wave propagating direction. In the boundary acoustic wave filter device 600, narrow pitch electrode finger portions 611A, 611B, 612A and 613A are provided. FIG. 3 shows the filter characteristic of the longitudinally coupled resonator boundary acoustic wave filter device according to the present preferred embodiment manufactured as described above. FIG. 5 shows the filter characteristic of the boundary acoustic wave filter device of the comparative example.

As shown in FIG. 5, in the existing boundary acoustic wave filter device 600, in a range from about 1930 MHz to about 1990 MHz, which is a pass band and a PCS receiving band, many large ripples occurred and the maximum insertion loss within the pass band was about 4.2 dB.

In contrast, as shown in FIG. 3, in the longitudinally coupled resonator boundary acoustic wave filter device 100 of the present preferred embodiment, almost no ripple due to a transverse mode occurred, and the maximum insertion loss within the pass band was about 1.7 dB. Thus, the insertion loss was greatly reduced.

Figure 6:
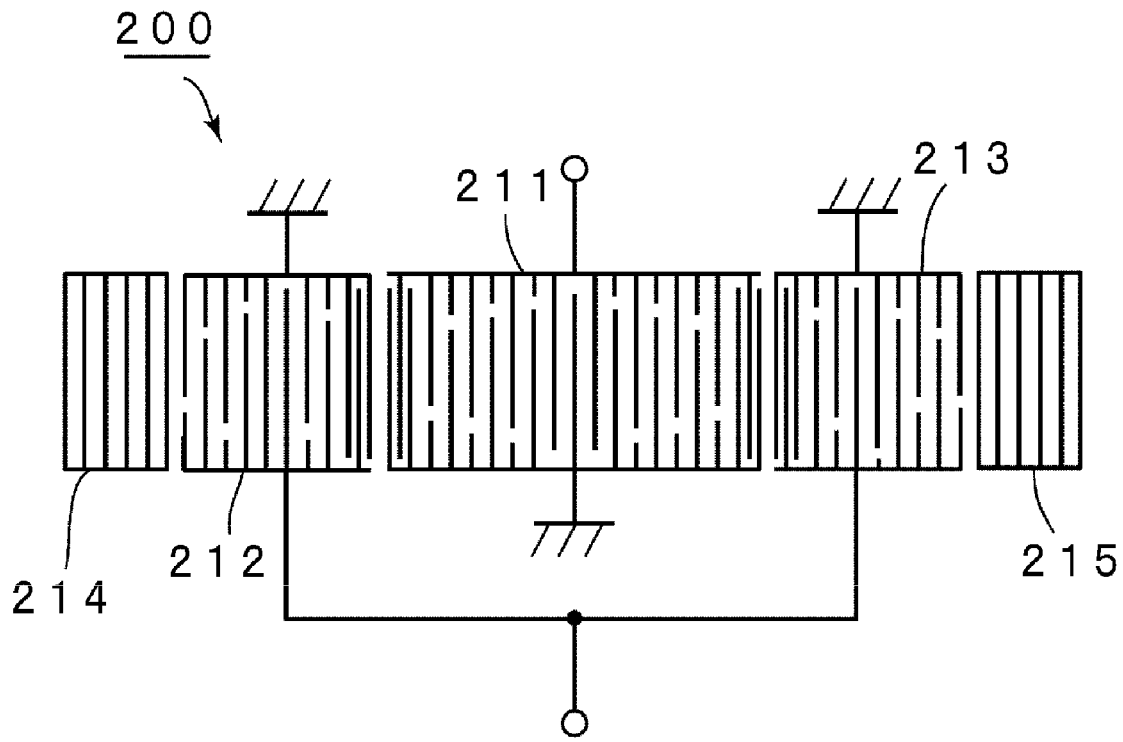
FIG. 6 is a schematic plan view that shows the electrode structure of a boundary acoustic wave filter device according to a second comparative example.
Figure 7:
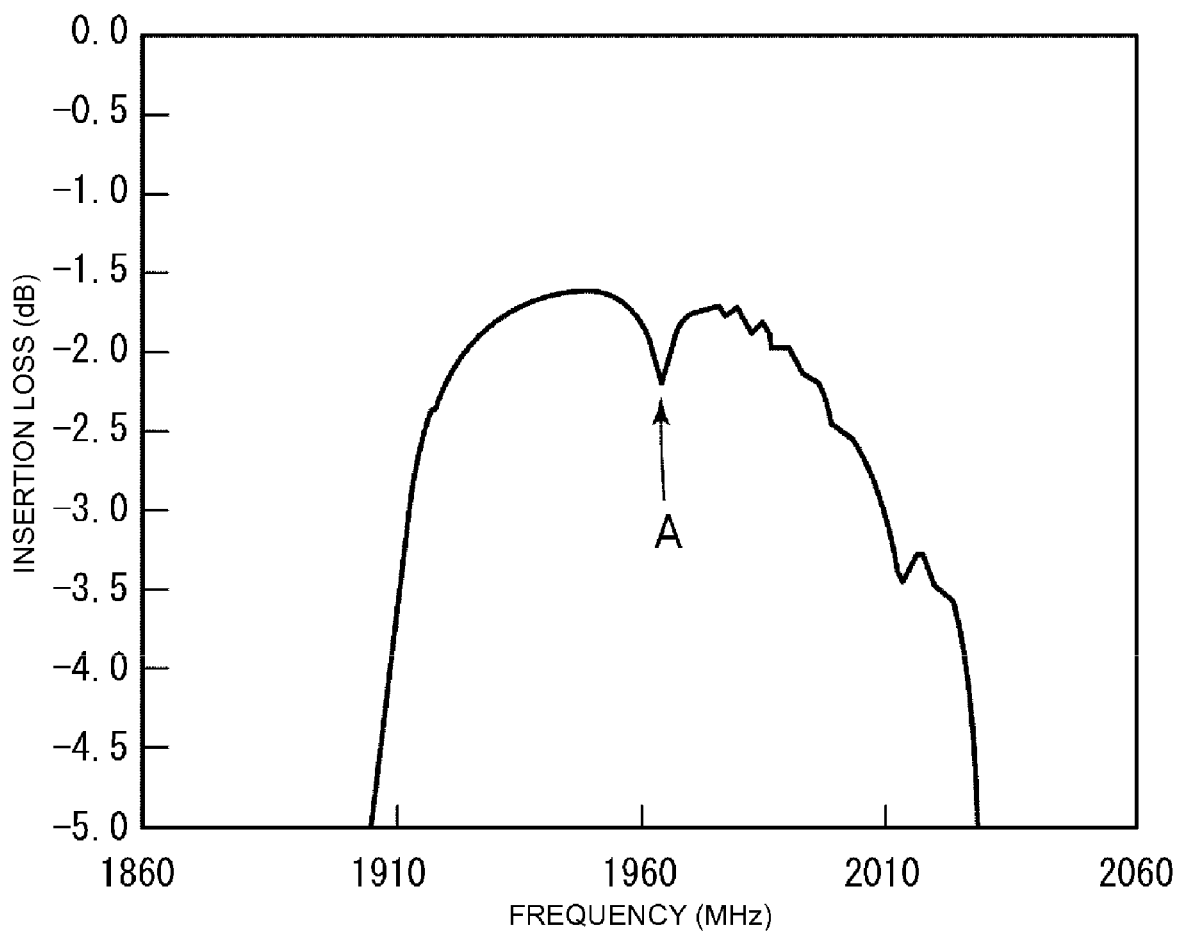
FIG. 7 is a view that shows the filter characteristic of the boundary acoustic wave filter device according to the second comparative example.

FIG. 6 is a schematic plan view that shows the electrode structure of a longitudinally coupled resonator boundary acoustic wave filter device according to a second comparative example. FIG. 7 is a view that shows the filter characteristic of the boundary acoustic wave filter device according to the second comparative example.

The boundary acoustic wave filter device 200 of the second comparative example is formed in a similar manner to the boundary acoustic wave filter device 100, except that apodization weights are assigned differently from the boundary acoustic wave filter device 100.

In a first IDT 211 and second and third IDTs 212 and 213, apodization weights are assigned in the IDTs 211 to 213 so that the overlap width of electrode fingers located in the approximate middle is a maximum and the overlap width reduces toward an ends of each IDT. Reflectors 214 and 215 are arranged on both sides of the portion in which the IDTs 211 to 213 are provided. The sizes of the maximum overlap width and minimum overlap width are substantially equal to those of the boundary acoustic wave filter device 100. As shown in FIG. 7, in the boundary acoustic wave filter device 200, as compared to the boundary acoustic wave filter device 600, ripples in the pass band were somewhat reduced. However, a large ripple indicated by arrow A occurred at about 1960 MHz in the middle of the pass band. Thus, the maximum insertion loss within the pass band is deteriorated to about 2.2 dB.

Thus, as in the case of the boundary acoustic wave filter device 100, the apodization weights need to be assigned so that ends adjacent to the narrow pitch electrode finger portions have a maximum overlap width.

Note that in preferred embodiments of the present invention, it is more preferable that, at portions at which IDTs are located adjacent to each other, the weights assigned in the adjacent IDTs are substantially symmetrical with respect to the approximate middle between the adjacent IDTs. In the boundary acoustic wave filter device 100, the apodization weights of the IDT 111 are assigned so that the overlap width weights of the half of the IDT 111 adjacent to the IDT 112 and the overlap width weights of the IDT 112 are substantially symmetrically arranged with respect to the approximate middle between the IDTs 111 and 112. Similarly, the apodization weights of the half of the IDT 111 adjacent to the IDT 113 and the apodization weights of the IDT 113 are substantially symmetrical with respect to the approximate middle between the IDTs 111 and 113. Thus, it is possible to further effectively suppress a transverse mode with the apodization weights, and to further effectively suppress a transverse mode ripple within the pass band.

Note that in the present preferred embodiment, the three-IDT type longitudinally coupled resonator boundary acoustic wave filter device is described. However, it may be a five-IDT type longitudinally coupled resonator boundary acoustic wave filter device in which fourth and fifth IDTs are arranged respectively on both sides of the portion in which the first to third IDTs are provided in the boundary acoustic wave propagating direction. In this case, the first and second reflectors are respectively provided on both sides of the portion in which the first to fifth IDTs are provided in the boundary acoustic wave propagating direction. Then, in the case of the five-IDT type longitudinally coupled resonator boundary acoustic wave filter device, the second and fourth IDTs and the third and fifth IDTs include narrow pitch electrode finger portions at portions at which the second and fourth IDTs are located adjacent to each other and at portions at which the third and fifth IDTs are located adjacent to each other, the apodization weights are assigned in the fourth and fifth IDTs so that the electrode finger overlap width sequentially changes in the boundary acoustic wave propagating direction, and the apodization weights are assigned in the fourth and fifth IDTs, so that the electrode fingers located adjacent to the second and third IDTs have a maximum overlap width. In this case, the apodization weights are assigned so that the maximum overlap width portions of the second and third IDTs are located at end portions adjacent to the fourth and fifth IDTs. That is, the apodization weights similar to the first IDT 111 shown in FIG. 1 are assigned in the second and third IDTs.

In this manner, in the five-IDT type longitudinally coupled resonator boundary acoustic wave filter device including the first to fifth IDTs, by assigning the apodization weights in accordance with preferred embodiments of the present invention, it is possible to effectively suppress a transverse mode ripple within the pass band.

Figure 8:
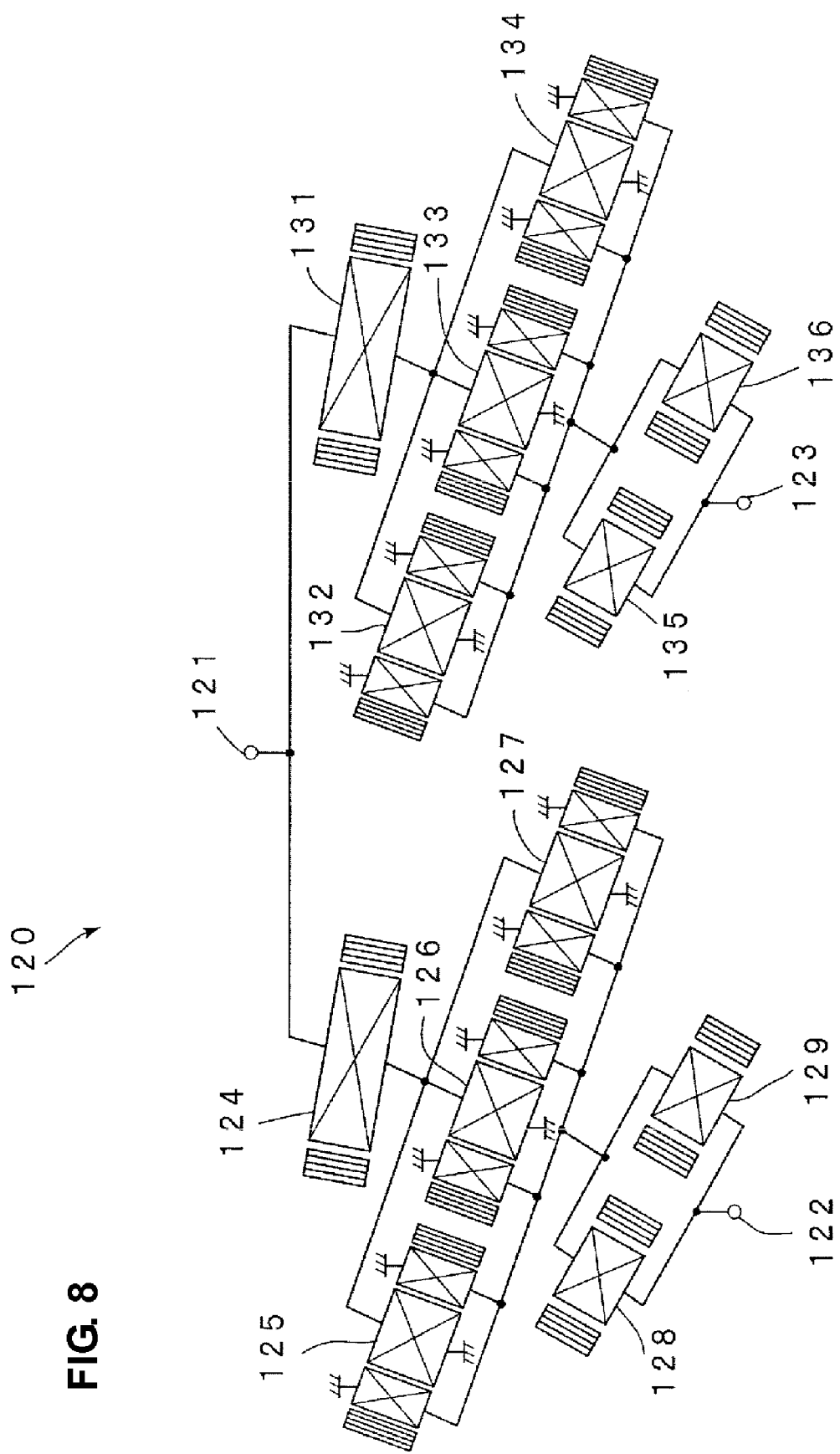
FIG. 8 is a schematic plan view that shows the electrode structure of a boundary acoustic wave filter device according to another preferred embodiment of the present invention.
Figure 9:
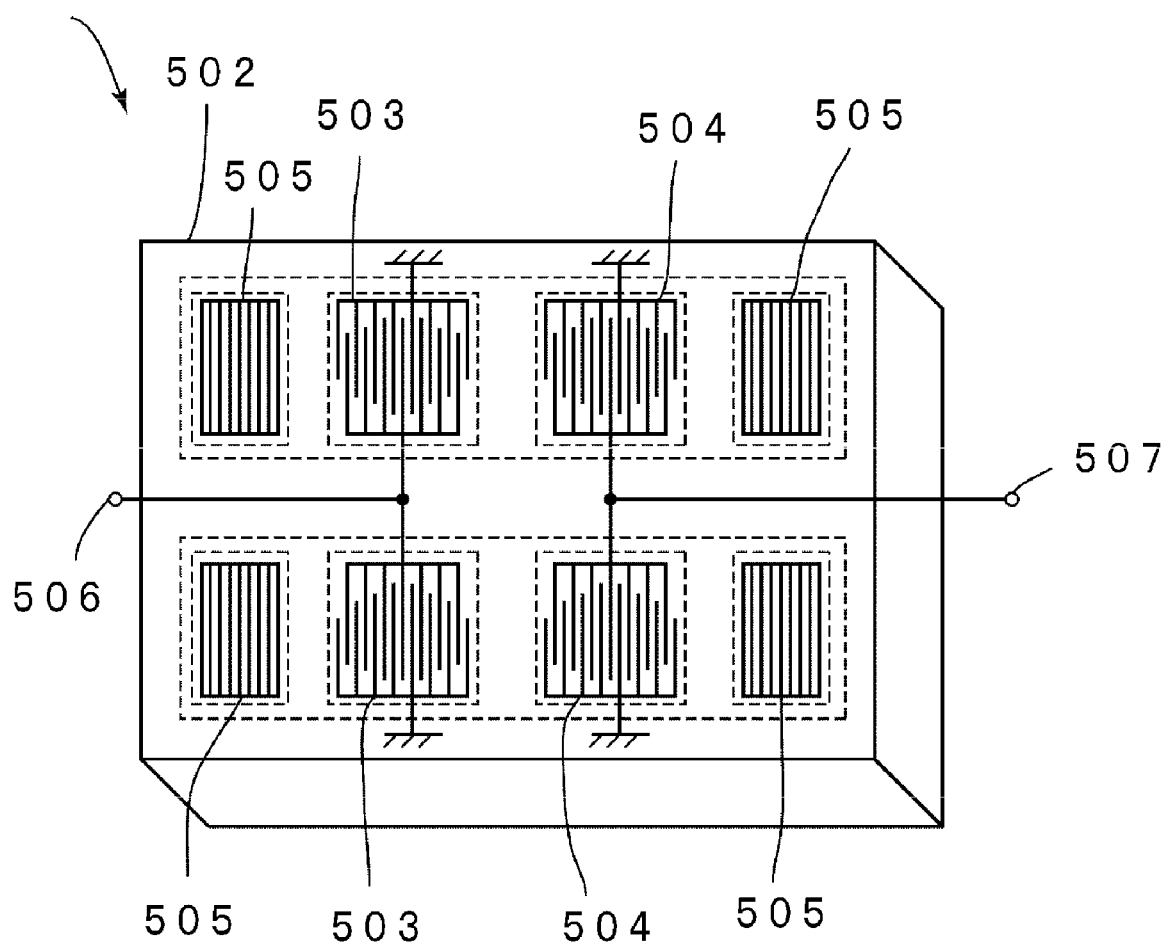
FIG. 9 is a perspective view that shows an example of an existing surface acoustic wave filter device.

In addition, preferred embodiments of the present invention are not limited to the single three-IDT type longitudinally coupled resonator boundary acoustic wave filter device 100 shown in FIG. 1. As shown in FIG. 8, preferred embodiments of the present invention may also be applied to a boundary acoustic wave filter device that has a balance-unbalance conversion function and that includes a plurality of three-IDT type longitudinally coupled resonator boundary acoustic wave filter devices connected to each other. In FIG. 8, the structures of the IDTs are schematically shown by symbols, X, that are placed inside the rectangular portions. As in the case of the longitudinally coupled resonator boundary acoustic wave filter device 100, first to third IDTs have narrow pitch electrode finger portions and apodization weights are assigned as in the case of the first to third IDTs 111 to 113.

In the boundary acoustic wave filter device 120 shown in FIG. 8, the electrode structure shown in the drawing is connected between an unbalanced terminal 121 and first and second balanced terminals 122 and 123. That is, three three-IDT type longitudinally coupled resonator boundary acoustic wave filter portions 125 to 127 are connected to the unbalanced terminal 121 via a one-port boundary acoustic wave resonator 124. The longitudinally coupled resonator boundary acoustic wave filter portions 125 to 127 are three-IDT type longitudinally coupled resonator boundary acoustic wave filters that are configured similarly to the longitudinally coupled resonator boundary acoustic wave filter device 100. The longitudinally coupled resonator boundary acoustic wave filter portions 125 to 127 are connected to the first balanced terminal 122 via one-port boundary acoustic wave resonators 128 and 129 that are connected in parallel with each other.

Three three-IDT longitudinally coupled resonator boundary acoustic wave filter portions 132 to 134 are connected to the unbalanced terminal 121 via a one-port boundary acoustic wave resonator 131. Then, the three three-IDT type longitudinally coupled resonator boundary acoustic wave filter portions 132 to 134 are connected to the second balanced terminal 123 via one-port boundary acoustic wave resonators 135 and 136 that are connected in parallel with each other.

The phase of the first to third IDTs of each of the longitudinally coupled resonator boundary acoustic wave filter portions 132 to 134 and the phase of the first to third IDTs of each of the longitudinally coupled resonator boundary acoustic wave filter portions 125 to 127 are adjusted such that, when the unbalanced terminal 121 is used as an input terminal, the phase of an output signal extracted from the second balanced terminal 123 is different by about 180 degrees from the phase of an output signal extracted from the first balanced terminal 122. Thus, in the boundary acoustic wave filter device 120, the balance-unbalance conversion function is provided, and, in accordance with preferred embodiments of the present invention, the narrow pitch electrode finger portions are provided at portions at which IDTs are located adjacent to each other and the apodization weights are assigned in the first to third IDTs in the similar manner to the boundary acoustic wave filter device 100. Thus, it is possible to sufficiently reduce a transverse mode ripple within the pass band, and to reduce an insertion loss.

Note that the piezoelectric body is not limited to LiNbO$_3$. Instead, the piezoelectric body may preferably be made of various piezoelectric monocrystals or piezoelectric ceramics, such as LiTaO$_3$ or rock crystal, for example. In addition, the dielectric body may be made of silicon oxide other than SiO$_2$ or other dielectric bodies such as SiN, for example. The electrode material is not specifically limited. An electrode film that includes IDTs may be formed of a metal film by laminating a plurality of metal layers.

Note that uses for the preferred embodiments of the present invention is not limited to the boundary acoustic wave filter device, and preferred embodiments of the present invention may also be applied to a surface acoustic wave filter device that is configured so that an electrode structure including IDTs are provided on the upper surface of the piezoelectric body. In this case, similarly, it is possible to suppress a ripple due to a transverse mode and to reduce an insertion loss.

However, the transverse mode ripple tends to appear more significantly in the boundary acoustic wave filter device as compared to the surface acoustic wave filter device, so that preferred embodiments of the present invention is more effective in the boundary acoustic wave filter device.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An acoustic wave filter device comprising:
  a piezoelectric body;
  a first IDT arranged on the piezoelectric body;
  second and third IDTs respectively arranged on both sides of the first IDT in an acoustic wave propagating direction in which an acoustic wave propagates; and
  first and second reflectors respectively arranged on both side of a portion of the piezoelectric body in which the first to third IDTs are provided in the acoustic wave propagating direction; wherein
  at portions in which the first, second, and third IDTs are located adjacent to each other in the acoustic wave propagating direction, an interval of electrode fingers of portions of the first, second, and third IDTs at end portions adjacent to an adjacent one of the first, second, and third IDTs is narrower than an interval of electrode fingers of the remaining portions of the first, second, and third IDTs to thereby define narrow pitch electrode finger portions;
  the acoustic wave filter device is a longitudinally coupled resonator acoustic wave filter device that utilizes an inter-IDT resonance mode; and
  apodization weights are assigned in the first, second, and third IDTs having the narrow pitch electrode finger portions at portions other than the narrow pitch electrode finger portions, such that an electrode finger overlap width sequentially changes in the acoustic wave propagating direction and portions located at end portions adjacent to the narrow pitch electrode finger portions have a maximum electrode finger overlap width.

2. The acoustic wave filter device according to claim 1, wherein the apodization weights are assigned such that, in the first IDT, a minimum overlap width portion is located at an approximate middle of the first IDT and maximum overlap width portions are located at end portions of the first IDT having the apodization weights adjacent to the second IDT and adjacent to the third IDT, wherein a portion surrounded by a single pair of envelope lines defined by the apodization weights has a substantial drum shape.

3. The acoustic wave filter device according to claim 1, wherein the apodization weights are assigned such that:
  a maximum overlap width portion is located at an end portion of the second IDT having the apodization weights adjacent to the first IDT, a minimum overlap width portion is located at an end portion of the second IDT having the apodization weights adjacent to the first reflector, and the overlap width sequentially reduces from the maximum overlap width to the minimum overlap width; and
  a maximum overlap width portion is located at an end portion of the third IDT having the apodization weights adjacent to first IDT, a minimum overlap width portion is located at an end portion of the third IDT having the apodization weights adjacent to the second reflector, and the overlap width sequentially reduces from the maximum overlap width portion to the minimum overlap width portion.

4. The acoustic wave filter device according to claim 1, wherein
at a portion in which the first and second IDTs are located adjacent to each other, the apodization weights are assigned so that the overlap widths of electrode fingers of the respective first and second IDTs located equidistantly from the approximate middle between the first and second IDTs are substantially equal; and
at a portion in which the first and third IDTs are located adjacent to each other, the overlap widths of electrode fingers of the respective first and third IDTs located equidistantly from the approximate middle between the first and third IDTs are substantially equal.

5. The acoustic wave filter device according to claim 1, wherein fourth and fifth IDTs are respectively arranged on both sides of the portion of the piezoelectric body in which the first to third IDTs are provided in the acoustic wave propagating direction, and the first and second reflectors are respectively arranged on both sides of the portion of the piezoelectric body in which the first to fifth IDTs are provided in the acoustic wave propagating direction.

6. The acoustic wave filter device according to claim 5, wherein the apodization weights are assigned in the second IDT such that the maximum overlap width portion is located at the approximate middle of the second IDT in the acoustic wave propagating direction and maximum overlap width portions are located at end portions of the second IDT having the apodization weights adjacent to the fourth IDT and adjacent to the first IDT, wherein a portion surrounded by a single pair of envelope lines defined by the apodization weights has a substantial drum shape.

7. The acoustic wave filter device according to claim 5, wherein the apodization weights are assigned in the third IDT so that the maximum overlap width is located in the approximate middle of the third IDT in the acoustic wave propagating direction and maximum overlap width portions are located at end portions of the third IDT having the apodization weights adjacent to the first IDT and adjacent to the fifth IDT, wherein a portion surrounded by a single pair of envelope lines defined by the apodization weights has a substantial drum shape.

8. The acoustic wave filter device according to claim 5, wherein the second and fourth IDTs respectively include narrow pitch electrode finger portions at a portion in which the second IDT and the fourth IDT are located adjacent to each other, the third and fifth IDTs respectively include narrow pitch electrode finger portions at a portion in which the third and fifth IDTs are located adjacent to each other, apodization weights are assigned in the fourth and fifth IDTs in portions other than the narrow pitch electrode finger portions, such that the electrode finger overlap width sequentially changes in the acoustic wave propagating direction, and the electrode fingers of end portions of the fourth and fifth IDTs having the apodization weights adjacent to the second and third IDTs have a maximum overlap width.

9. The acoustic wave filter device according to claim 1, further comprising a dielectric body layer laminated on the piezoelectric body, wherein a boundary acoustic wave is utilized as the acoustic wave.

10. The acoustic wave filter device according to claim 1, wherein a surface acoustic wave is utilized as the acoustic wave.

* * * * *